US008138574B2

(12) United States Patent
Chen et al.

(10) Patent No.: US 8,138,574 B2
(45) Date of Patent: Mar. 20, 2012

(54) PCM WITH POLY-EMITTER BJT ACCESS DEVICES

(75) Inventors: Tze-Chiang Chen, Yorktown Heights, NY (US); Chung Hon Lam, Yorktown Heights, NY (US); Bipin Rajendran, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 12/510,588

(22) Filed: Jul. 28, 2009

(65) Prior Publication Data

US 2011/0024712 A1    Feb. 3, 2011

Related U.S. Application Data

(63) Continuation-in-part of application No. 12/121,875, filed on May 16, 2008, now Pat. No. 7,811,879.

(51) Int. Cl.
*H01L 27/06* (2006.01)

(52) U.S. Cl. ............... 257/539; 257/1; 257/2; 257/5; 257/536; 257/E27.021; 257/E27.032; 365/148

(58) Field of Classification Search .......... 257/1, 2, 257/5, 205, 477, 536, 539, E27.019, E27.021, 257/E27.03, E27.032; 365/148
See application file for complete search history.

(56) References Cited

U.S. PATENT DOCUMENTS

| 6,392,913 | B1 | 5/2002 | Sandhu | |
|---|---|---|---|---|
| 6,989,580 | B2 * | 1/2006 | Pellizzer et al. | 257/577 |
| 7,005,665 | B2 | 2/2006 | Furkay et al. | |
| 7,208,751 | B2 * | 4/2007 | Ooishi | 257/5 |
| 7,811,879 | B2 * | 10/2010 | Lam et al. | 438/234 |
| 2007/0120105 | A1 | 5/2007 | Chao et al. | |
| 2008/0147050 | A1 | 6/2008 | Mann et al. | |
| 2008/0203379 | A1 | 8/2008 | Magistretti | |

OTHER PUBLICATIONS

Hwang, Y.N., et al. Phase-change chalcogenide nonvolatile RAM completely based on CMOS technology, International Symposium on VLSI Technology, Systems, and Applications (IEEE) Oct. 6-8, 2003, pp. 29-31.
U.S. Appl. No. 12/121,875, filed May 16, 2008. Titled: Process for PCM Integration with Poly-Emitter BJT as Access Devices.

* cited by examiner

*Primary Examiner* — Evan Pert
*Assistant Examiner* — Eduardo A Rodela
(74) *Attorney, Agent, or Firm* — Cantor Colburn LLP; Vazken Alexanian

(57) ABSTRACT

A phase change memory (PCM) includes an array comprising a plurality of memory cells, a memory cell comprising a phase change element (PCE); and a PCE access device comprising a bipolar junction transistor (BJT), the BJT comprising an emitter region comprising a polycrystalline semiconductor. A memory cell for a phase change memory (PCM) includes a phase change element (PCE); and a PCE access device comprising a bipolar junction transistor (BJT), the BJT comprising an emitter region comprising a polycrystalline semiconductor.

11 Claims, 6 Drawing Sheets

PCM WITH POLY-EMITTER BJT ACCESS DEVICES

CROSS-REFERENCE TO RELATED APPLICATION

This application is a Continuation-in-Part of U.S. application Ser. No. 12/121,875 (Lam et al.), filed May 16, 2008, which issued as U.S. Pat. No. 7,811,879 on Oct. 12, 2010.

BACKGROUND

This disclosure relates generally to a memory cell structure and layout for a phase change memory (PCM) comprising poly-emitter bipolar junction transistors (BJTs) as access devices.

There are two major groups in computer memory: non-volatile memory and volatile memory. Constant (or nearly constant) input of energy in order to retain information is not necessary in non-volatile memory but is required for volatile memory. Thus, non-volatile memory devices contain memory in which the state of the memory elements may be retained for days to decades without power consumption. Examples of non-volatile memory devices include Read Only Memory (ROM), Flash Electrical Erasable Read Only Memory, Ferroelectric Random Access Memory, Magnetic Random Access Memory (MRAM), and Phase Change Memory (PCM). Examples of volatile memory devices include Dynamic Random Access Memory (DRAM and Static Random Access Memory (SRAM).

In a PCM, information is stored in memory cells comprising phase change elements (PCEs). A PCE comprises materials that can be manipulated into different phases. Each of these phases exhibits different electrical properties that may be used for storing information. Amorphous and crystalline phases are two phases typically used for bit storage (1's and 0's), as they have detectable differences in electrical resistance. Specifically, the amorphous phase has a higher resistance than the crystalline phase. An access device may supply the current necessary to change a PCE from one phase to another. Each PCE in the PCM may have a single associated access device.

A PCM array may be configured in a cross-point architecture, with the PCEs controlled by an access device such as a complementary metal oxide semiconductor (CMOS) transistors or diodes at every junction. However, a problem in high density PCM design is the drive current required to cause PCE phase changes. The small metal oxide semiconductor field effect transistor (MOSFET) devices necessary to provide a high density of bits per unit area may not provide sufficient current to switch the phase of a PCE. A tightly packed diode array may provide enough drive current to cause resistive phase change in a PCE, but a significant amount of current may cross over to adjacent PCEs, causing cross-talk between PCEs in high density PCMs. Another possibility is the use of bipolar junction transistors (BJTs) as access devices. However, integration of CMOS and BJT arrays has proven difficult; further discussion of this problem may be found in U.S. application Ser. No. 12/121,875 (Rajendran et al.), filed May 16, 2008, which is herein incorporated by reference in its entirety.

SUMMARY

An exemplary embodiment of a phase change memory (PCM) includes an array comprising a plurality of memory cells, a memory cell comprising a phase change element (PCE); and a PCE access device comprising a bipolar junction transistor (BJT), the BJT comprising an emitter region comprising a polycrystalline semiconductor.

An exemplary embodiment of a memory cell for a phase change memory (PCM) includes a phase change element (PCE); and a PCE access device comprising a bipolar junction transistor (BJT), the BJT comprising an emitter region comprising a polycrystalline semiconductor.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a memory cell structure and layout for a PCM driven by polycrystalline emitter (or poly-emitter) BJT devices are provided, with exemplary embodiments being discussed below in detail. Cross-talk between features may be limited through the use of poly-emitter BJTs as PCE access devices, as a BJT device having a polycrystalline emitter requires a smaller base current than a BJT having a single-crystalline emitter for an identical emitter current. A relatively small base current reduces cross-talk among memory cells while supplying sufficient current through the emitter to cause resistive phase change in a PCE. For a given feature size F, wherein F is the smallest realizable process dimension in the technology, a memory cell size of $6F^2$ or $5F^2$ may be achieved in various embodiments.

Figure 1:
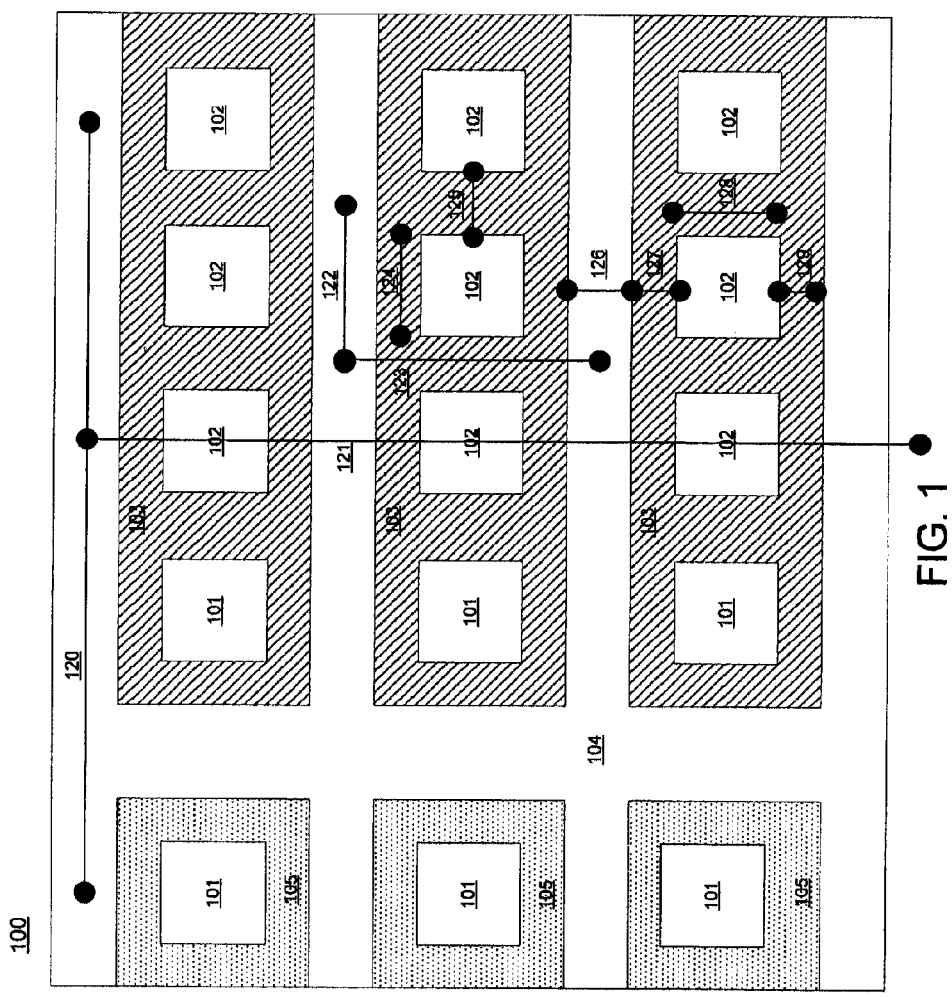
FIG. 1 illustrates an embodiment of a top view of a $6F^2$ layout for a PCM array comprising poly-emitter BJTs, where F denotes a minimum realizable process dimension.

FIG. 1 illustrates a top view of an embodiment of a layout 100 for a PCM array comprising poly-emitter BJT access devices with a feature square area of $6F^2$. Referring to FIG. 1, layout 100 comprises a plurality of tungsten (W) regions 101 and a plurality of P+ poly regions 102, surrounded by thin N+ base regions 103 and P+ doped collector contact regions 105. In some embodiments, a thin surface layer of regions 103 and 105 may comprise a metal silicide, such as cobalt (Co) or nickel (Ni), which may reduce the resistance of the current paths of regions 103 and 105. P+ regions 102 comprise polycrystalline BJT emitters formed from highly doped contact material. Thin N+ base regions 103 comprise BJT bases, and P+ doped collector contact regions 105 comprise BJT collector contacts. Regions 101-103 and 105 taken together form a plurality of parallel semiconductor regions comprising a plurality of BJT devices. The parallel semiconductor regions are separated by shallow trench isolation regions comprising silicon oxide 104. The BJT devices are placed along the parallel semiconductor regions at a minimum pitch, and are placed in the middle of the parallel semiconductor regions along a direction perpendicular to the parallel semiconductor regions. Line 126 is illustrates the width of a shallow trench, and is of feature length F. Lines 127, 128, and 129 taken together illustrate the width of a parallel semiconductor region. Line 127 is of length F/2, line 128 is of length F, and line 129 is of length F/2, for a total parallel semiconductor region width of 2F. Therefore, the width of a parallel semiconductor region is approximately twice that of a shallow trench isolation region. Line 124 and line 125 are each of feature length F. Line 122 is of length 2F, and line 123 is of length 3F, giving a total feature square size, or memory cell size, of $6F^2$. Line 120 illustrates the word line direction of the PCM layout 100, and line 121 illustrates the bit line direction of the PCM layout 100.

Figure 2:
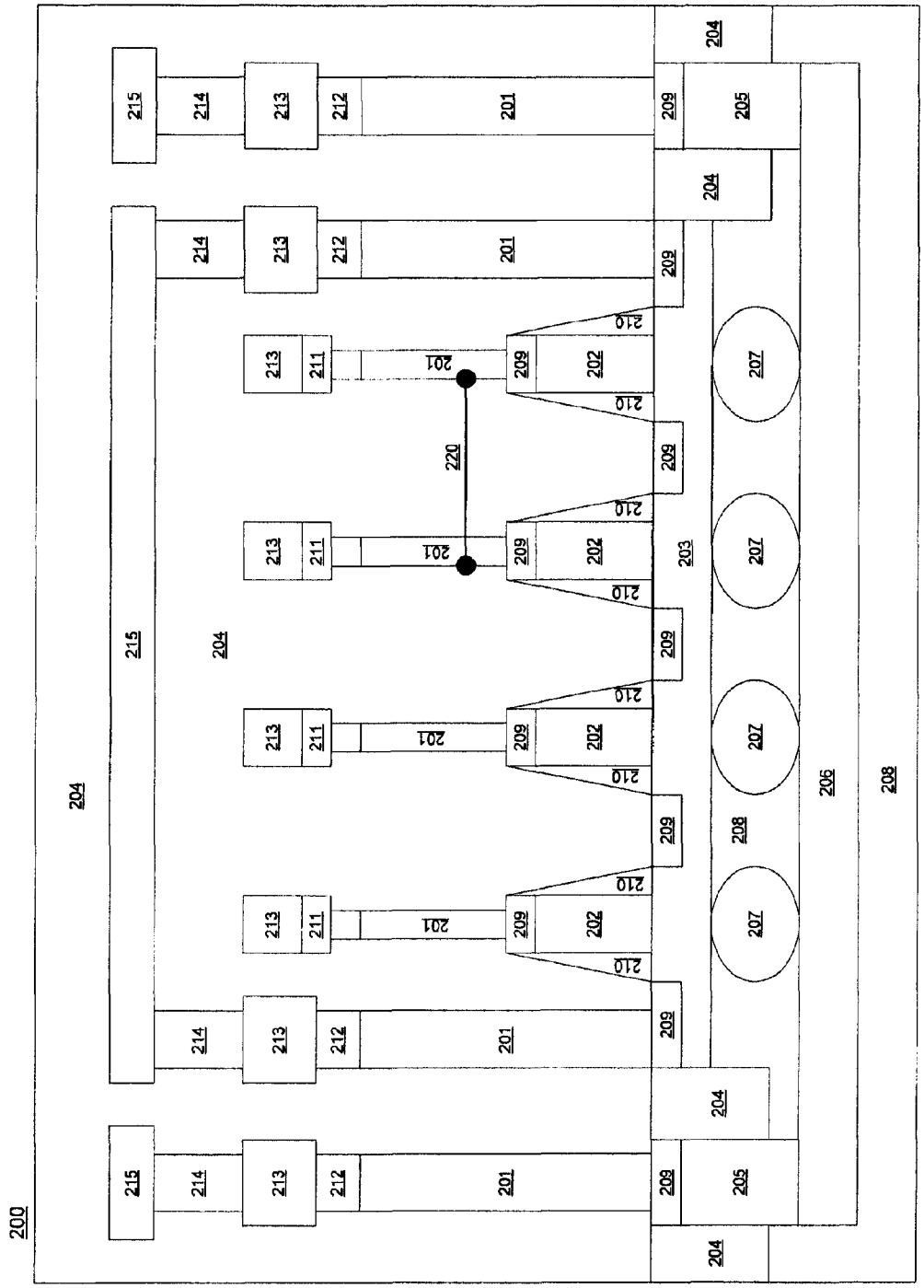
FIG. 2 illustrates an embodiment of a cross section along the word line direction of a $6F^2$ layout for a PCM array comprising poly-emitter BJTs.

FIG. 2 illustrates an embodiment of a cross section 200 of PCM array layout 100 along word line 120 as shown in FIG. 1. In this embodiment described below, the phase change memory element is controlled by a PNP poly-silicon emitter BJT. Regions 201 comprise tungsten, regions 202 comprise P+ poly material, regions 203 comprise thin N+ base material, regions 204 comprise silicon oxide, and regions 205 comprise highly doped P+, as discussed above regarding elements 101-105 of FIG. 1. Regions 206 comprise BJT sub-collectors. Regions 207 comprise BJT pedestal collectors. Regions 208 comprise P substrate. Regions 209 comprise metallic silicide, including but not limited to a silicide of nickel or cobalt, which reduces the overall resistance of regions 209. Regions 210 comprise sidewall spacers formed from silicon nitride, and act to insulate and protect the BJT emitters 202. Regions 211 comprise PCEs. Regions 212 and 214 comprise metal vias, and regions 213 and 215 comprise metal layers M1 and M2. Line 220 shows the distance 2F between BJT devices.

Figure 3:
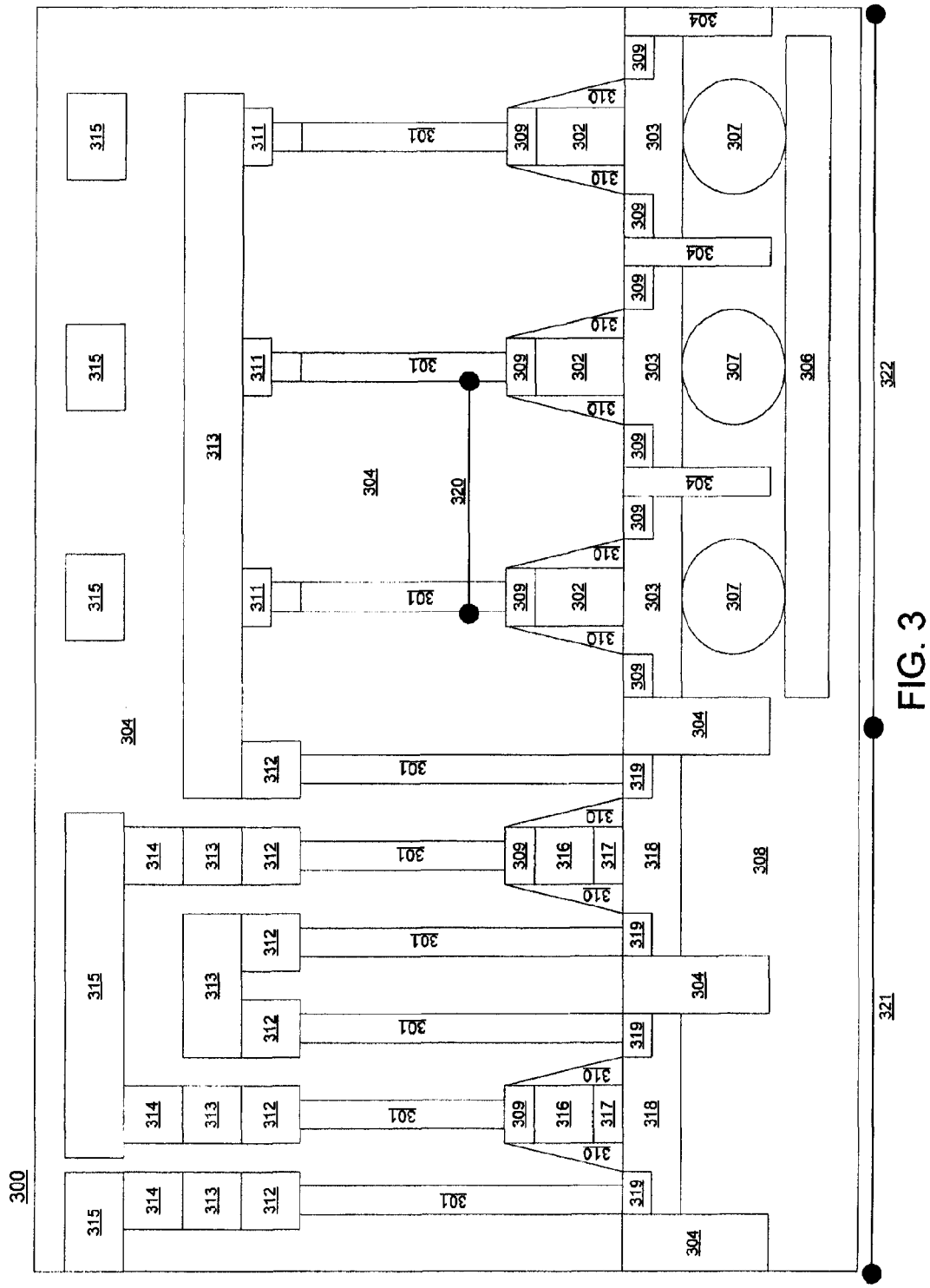
FIG. 3 illustrates an embodiment of a cross section along the bit line direction of a $6F^2$ layout for a PCM array comprising poly-emitter BJTs.

FIG. 3 illustrates an embodiment of a cross section 300 of PCM array layout 100 along bit line 121 as shown in FIG. 1. Line 321 illustrates the portion of cross section 300 corresponding to a peripheral CMOS circuit comprising field effect transistors (FETs), and line 322 illustrates the portion of cross section 300 corresponding to the PCM memory cell array comprising PCEs with BJT access devices. Regions 301 comprise tungsten, regions 302 comprise P+ poly material, regions 303 comprise thin N+ base material, and regions 304 comprise silicon oxide, as discussed above regarding elements 101-104 of FIG. 1. Regions 306 comprise BJT sub-collectors. Regions 307 comprise BJT pedestal collectors. Regions 308 comprise P substrate. Regions 309 comprise metallic silicide, including but not limited to nickel or cobalt silicides in some embodiments, which reduces resistance of regions 309. Regions 310 comprise sidewall spacers formed from silicon nitride, and act to insulate and protect the BJT emitters 302. Regions 311 comprise PCEs. Regions 312 and 314 comprise metal vias, and regions 313 and 315 comprise metal layers M1 and M2. Regions 316 comprise polysilicon gate regions of the FETs that comprise the peripheral CMOs circuit 321. Regions 317 are gate oxide regions of the FETs. Regions 318 are made from thin N+ material, and comprise FET channels. Regions 319 are made from heavily doped P+ regions underlying metallic silicide and comprise FET source/drain regions. Line 320 shows the distance 3F between BJT devices.

Figure 4:
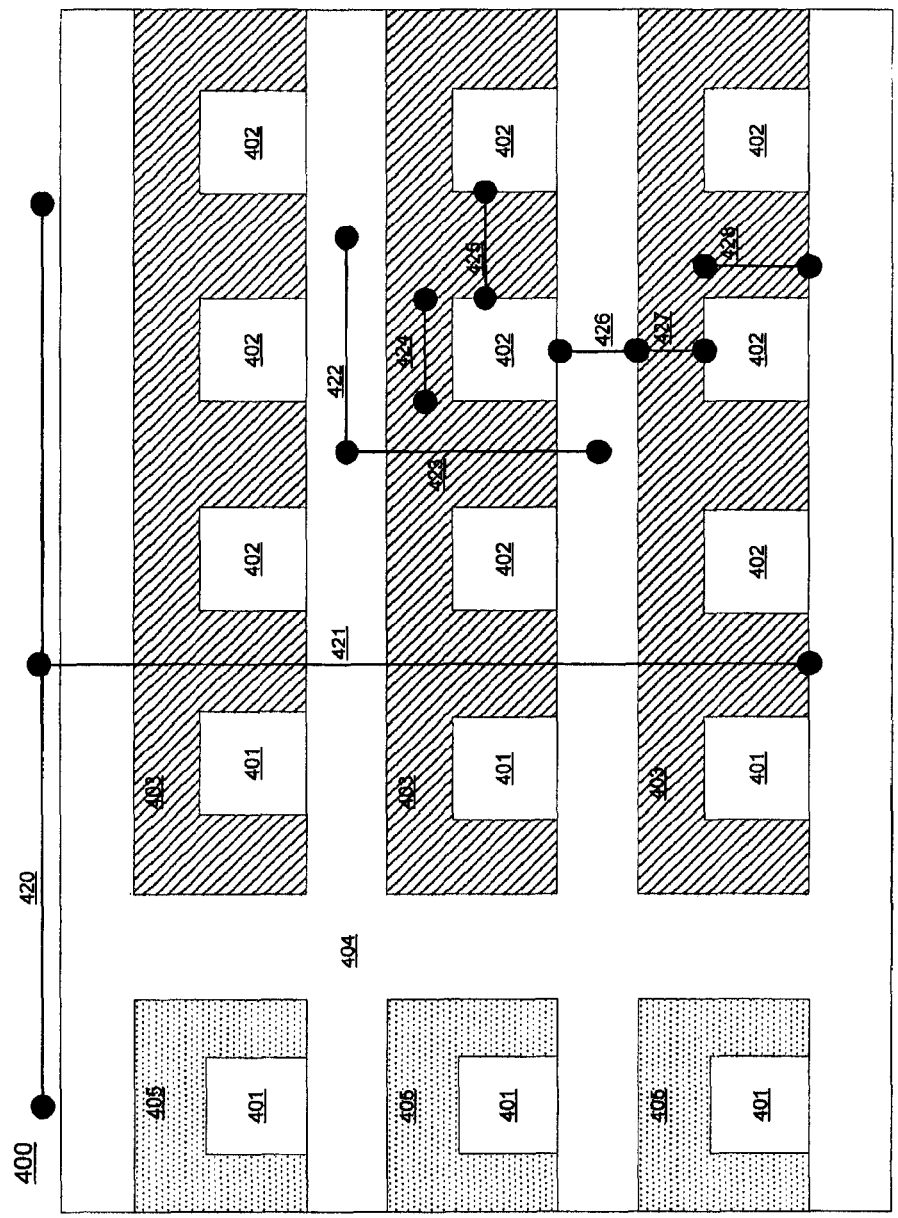
FIG. 4 illustrates an embodiment of a top view of a layout for a $5F^2$ layout for a PCM array comprising poly-emitter BJTs.

FIG. 4 illustrates an embodiment of a top view of a layout 400 for a PCM array comprising poly-emitter BJT access devices with a feature square area of $5F^2$. Referring to FIG. 4, layout 400 comprises a plurality of tungsten (W) regions 401 and a plurality of P+ poly regions 402 surrounded by thin N+ base regions 403 and P+ doped collector contact regions 405. In some embodiments, a thin surface layer of regions 403 and 405 may comprise metal silicides, such as Co or Ni, which may the resistance of the current paths of regions 403 and 405. P+ regions 402 comprise polycrystalline BJT emitters formed from highly doped contact material. Thin N+ base regions 403 comprise BJT bases. Regions 401-403 and 405 taken together form a plurality of parallel semiconductor regions comprising a plurality of BJT devices. The parallel semiconductor regions are separated by shallow trench isolation regions comprising silicon oxide 404. The BJT devices are placed in the parallel semiconductor regions at a minimum pitch, and are located adjacent to the shallow trench isolation regions. Line 426 illustrates the width of a shallow trench, and is of feature length F. Lines 427 and 428 taken together illustrate the width of a parallel semiconductor region. Line 427 is of length F/2 and line 428 is of length F, for a total parallel semiconductor region width of 1.5F. Therefore, the width of a parallel semiconductor region is approximately 1.5 times that of a shallow trench isolation region. Line 424 and line 425 are each of feature length F. Line 422 is of length 2F, and line 423 is of length 2.5F, giving a total feature square size, or memory cell size, of $5F^2$. Line 420 illustrates the word line direction of the PCM layout 400, and line 421 illustrates the bit line direction of the PCM layout 400.

Figure 5:
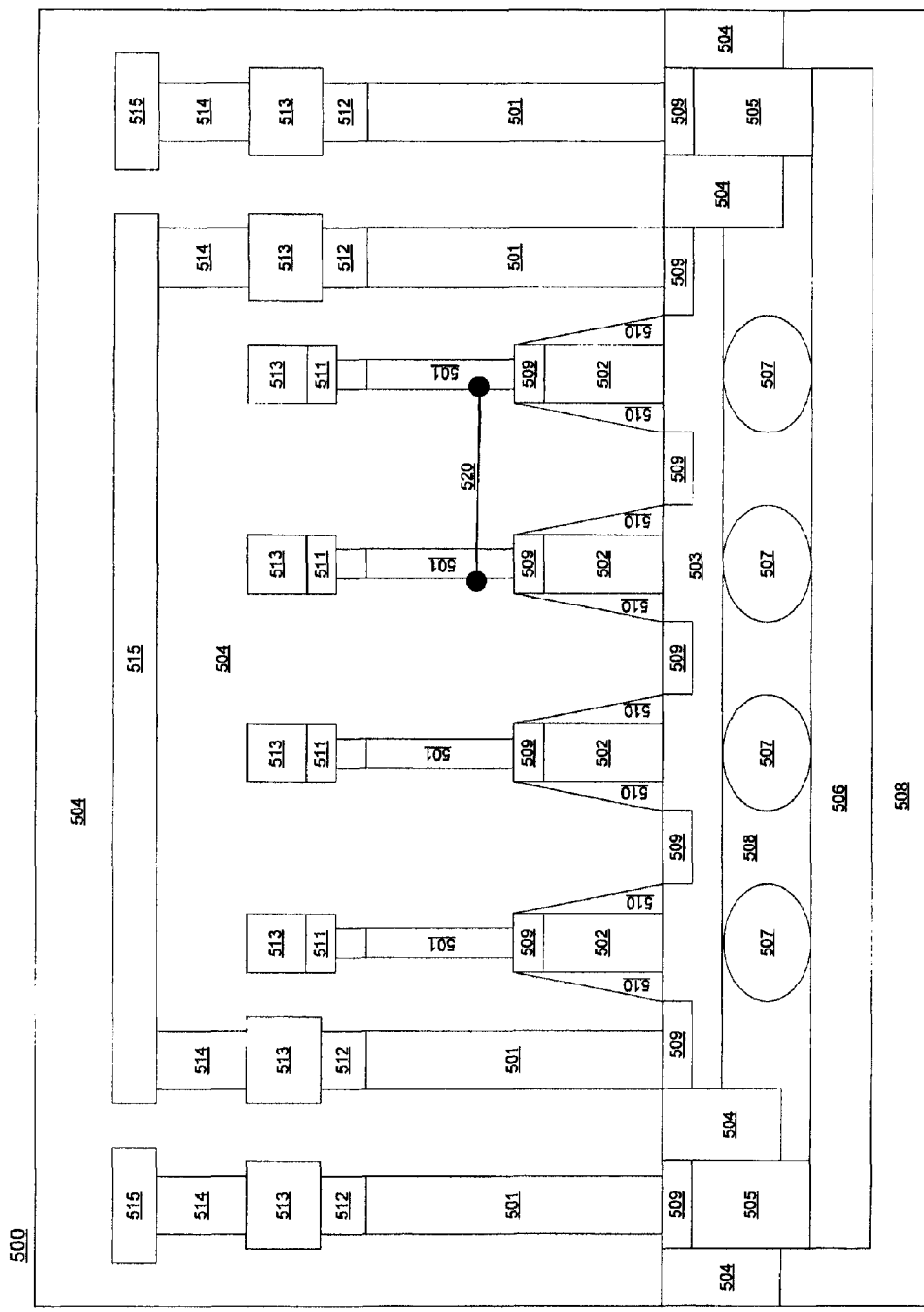
FIG. 5 illustrates an embodiment of a cross section along the word line direction of a $5F^2$ layout for a PCM array comprising poly-emitter BJTs.

FIG. 5 illustrates an embodiment of a cross section 500 of PCM layout 400 along word line 420 as shown in FIG. 4. Regions 501 comprise tungsten, regions 502 comprise P+ poly material, regions 503 comprise thin N+ base material, regions 504 comprise silicon oxide and regions 505 comprise P+ doped collector contact, as discussed above regarding elements 401-405 of FIG. 4. Regions 506 comprise BJT sub-collectors. Regions 507 comprise BJT pedestal collectors. Regions 508 comprise P substrate. Regions 509 comprise metallic silicide, including but not limited to nickel or cobalt silicide, which reduces resistance of regions 509. Regions 510 comprise sidewall spacers formed from silicon nitride, and act to insulate and protect the BJT emitters 502. Regions 511 comprise PCEs. Regions 512 and 514 comprise metal vias, and regions 513 and 515 comprise metal layers M1 and M2. Line 520 shows the distance 2F between BJT devices.

Figure 6:
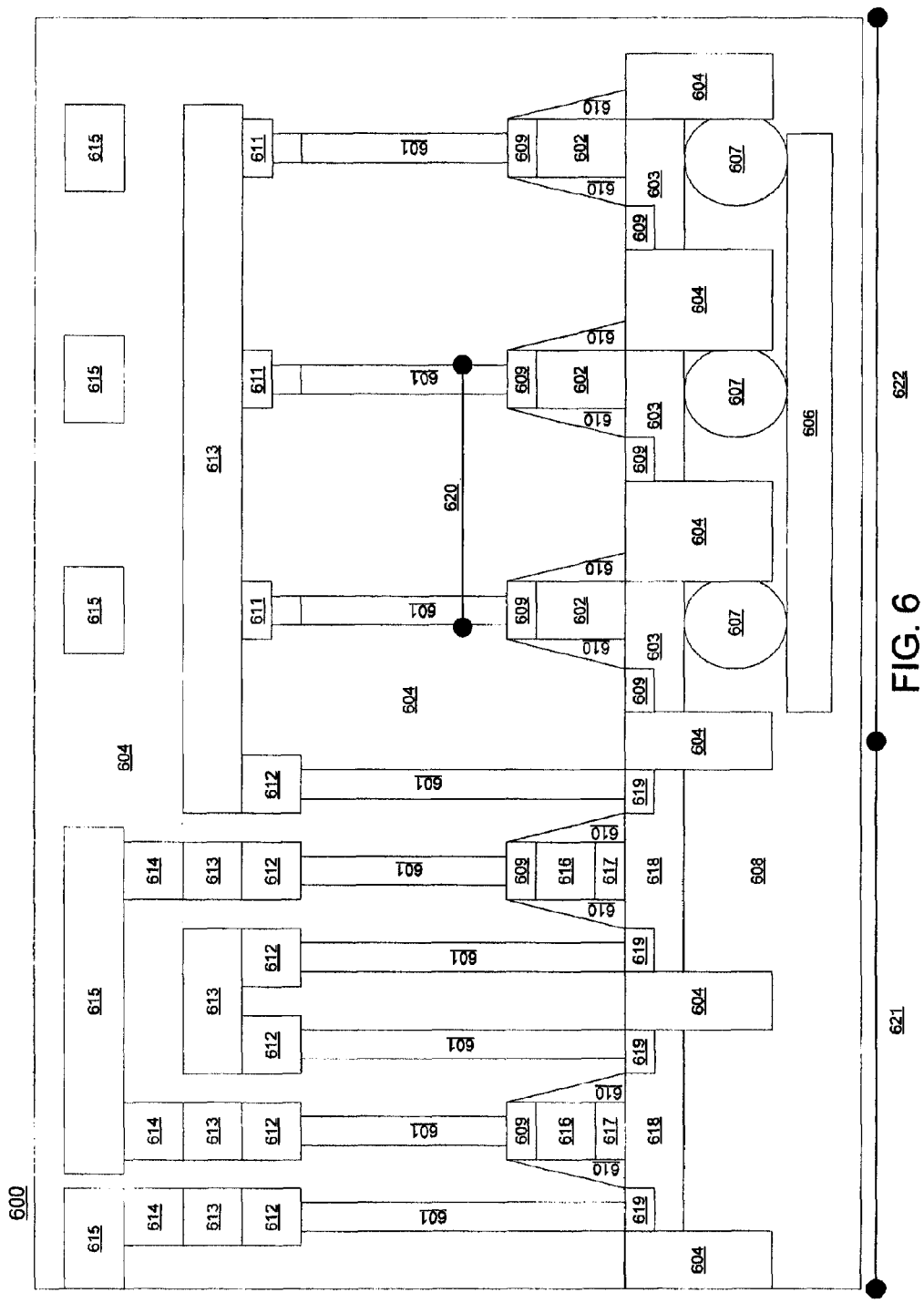
FIG. 6 illustrates an embodiment of a cross section along the bit line direction of a $5F^2$ layout for a PCM array comprising poly-emitter BJTs.

FIG. 6 illustrates an embodiment of a cross section 600 of PCM layout 400 shown along bit line 421 as shown in FIG. 4. Line 621 illustrates the portion of cross section 600 corresponding to a peripheral CMOS circuit comprising FETs, and line 622 illustrates the portion of cross section 600 corresponding to the PCM memory cell array comprising PCEs with BJT access devices. Regions 601 comprise tungsten, regions 602 comprise P+ poly material, regions 603 comprise thin N+ base material, and regions 604 comprise silicon oxide, as discussed above regarding elements 401-404 of FIG. 4. Regions 606 comprise BJT sub-collectors. Regions 607 comprise BJT pedestal collectors. Regions 608 comprise P substrate. Regions 609 comprise metallic silicide, including but not limited to nickel or cobalt silicide in some embodiments, which reduces resistance of regions 609. Regions 610 comprise sidewall spacers formed from silicon nitride, and act to insulate and protect the BJT emitters 602. Regions 611 comprise PCEs. Regions 612 and 614 comprise metal vias and regions 613 and 615 comprise metal layers M1 and M2. Regions 616 comprise polysilicon gate regions of the FETs that comprise the peripheral CMOs circuit 621. Regions 617 are gate oxide regions of the FETs. Regions 618 are made from thin N+ material, and comprise FET channels. Regions 619 are made from heavily doped P+ regions underlying metallic silicide and comprise FET source/drain regions. Line 620 shows the distance 2.5F between BJT devices.

The technical effects and benefits of exemplary embodiments include a PCM array with relatively low cross-talk between memory cells, allowing for a high-density memory array in some embodiments.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Further, the figures are not necessarily drawn to scale.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A phase change memory (PCM) comprising:
an array comprising a plurality of memory cells, a memory cell comprising:
a phase change element (PCE); and
a PCE access device comprising a bipolar junction transistor (BJT), the BJT comprising an emitter region comprising a polycrystalline semiconductor;
wherein a cross-section of an emitter region of the BJT comprises a square having an area and a side length, and wherein an area of a memory cell of the plurality of memory cells is 5 or 6 times the area of the cross-section of the emitter region of the BJT.

2. The PCM of claim 1, wherein the array comprises a plurality of parallel semiconductor regions separated by a plurality of shallow trench isolation regions, and wherein the plurality of memory cells are located in the plurality of parallel semiconductor regions.

3. The PCM of claim 2, wherein the parallel semiconductor regions have a width that is approximately twice the side length of the cross-section of the emitter region of the BJT, and the shallow trench isolation regions have a width that is equal to the side length of the cross-section of the emitter region of the BJT.

4. The PCM of claim 2, wherein a plurality of memory cells are located in the middle of the parallel semiconductor regions such that a plurality of BJTs associated with the plurality of memory cells are separated from an edge of the shallow trench isolation regions by at least a distance of half of the side length of the cross-section of the emitter region of the BJT in all directions.

5. The PCM of claim 2, wherein the parallel semiconductor regions are of a width that is approximately 1.5 times the side length of the cross-section of the emitter region of the BJT, and the shallow trench isolation regions are of a width that is equal to the side length of the cross-section of the emitter region of the BJT.

6. The PCM of claim 2, wherein a plurality of memory cells are located in the parallel semiconductor regions such that a plurality of BJTs associated with the plurality of memory cells are adjacent to the shallow trench isolation region on a first side and are separated from an edge of the shallow trench isolation regions by at least a width of half of the side length of the cross-section of the emitter region of the BJT on a second side that is opposite the first side.

7. The PCM of claim 1, wherein the BJT comprises a sidewall spacer comprising silicon nitride.

8. A memory cell for a phase change memory (PCM), comprising:
a phase change element (PCE); and
a PCE access device comprising a bipolar junction transistor (BJT), the BJT comprising an emitter region comprising a polycrystalline semiconductor;
wherein a cross-section of an emitter region of the BJT comprises a square that has an area and a side length, and wherein an area of the memory cell is 5 or 6 times the area of the cross-section of the emitter region of the BJT.

9. The memory cell for a PCM of claim 8, wherein the BJT comprises a sidewall spacer comprising silicon nitride.

10. The memory cell for a PCM of claim 8, wherein the BJT is separated from a BJT in an adjacent memory cell by a distance that is approximately twice the side length of the cross-section of the emitter region of the BJT in a word line direction of the PCM, and by a distance that is three times the side length of the cross-section of the emitter region of the BJT in a bit line direction of the PCM.

11. The memory cell for a PCM of claim 8, wherein the BJT is separated from a BJT in an adjacent memory cell by a distance that is approximately twice the side length of the cross-section of the emitter region of the BJT in a word line direction of the PCM, and by a distance that is two and a half times the side length of the cross-section of the emitter region of the BJT in a bit line direction of the PCM.

* * * * *